United States Patent [19]

Viola

[11] 4,337,293
[45] Jun. 29, 1982

[54] SYSTEM OF MAKING CUSTOM TRANSFERS

[76] Inventor: Michael R. Viola, 3501 N. Natchez Ave., Chicago, Ill. 60634

[21] Appl. No.: 266,581

[22] Filed: May 22, 1981

Related U.S. Application Data

[62] Division of Ser. No. 175,317, Aug. 4, 1980, Pat. No. 4,304,837.

[51] Int. Cl.$^3$ .............................................. B32B 9/04
[52] U.S. Cl. .................................. 428/337; 428/411; 428/446; 428/484; 428/522
[58] Field of Search ............... 428/337, 411, 446, 448, 428/451, 484, 522; 430/252

[56] References Cited

U.S. PATENT DOCUMENTS

| | | | |
|---|---|---|---|
| 2,742,358 | 4/1956 | Brown | 430/289 |
| 4,115,622 | 9/1978 | Cartier | 428/446 |
| 4,202,663 | 5/1980 | Haigh | 428/451 |
| 4,254,211 | 3/1981 | Scrutton et al. | 430/252 |

*Primary Examiner*—J. Travis Brown
*Attorney, Agent, or Firm*—McWilliams, Mann & Zummer

[57] ABSTRACT

A system of making custom transfers using as the image transfer implement clear or transparent polyvinyl chloride film in sheeting form that is pretreated in practicing the invention to have on its side that is to bear the image to be transferred a polyvinyl alcohol overcoated adhesion and release coating that forms an incipient image receiving transfer medium, in which system the image that is selected to be transferred is photographed to provide the image of same in the usual photographic negative format, and a section, of appropriate size, of the transfer implement serving film is severed from the stock of such film to provide a transfer sheet that is further processed for completing and sensitizing the sheet transfer medium for photographic application to same, and in enlarge form, the image to be transferred. In the processing of the film sheet that serves as the transfer implement, after being cut to size it is applied to, in accordance with the invention, a special resilient coating board and has a first sensitizing, color pigment free polyvinyl emulsion applied to the sheet incipient transfer medium that is dried and followed by a second coating of the sensitized polyvinyl emusion that at this time includes color pigment of the image color selected, which coating is again followed by drying. The thus treated film sheet transfer implement then has its transfer medium photographically exposed, using an ultra violet light equipped projector that mounts the negative bearing the image, for photographically applying the image to the transfer medium of the film sheet, and in enlarged form. After the exposure, the exposed film sheet is developed by employing water spray techniques to wash away the unexposed sensitized polyvinyl, which leaves as the transfer medium only the exposed polyvinyl that is pigment colored. After drying of the film sheet, the side of the film sheet bearing the finalized transfer medium has a uniform layer of suitable pressure sensitive adhesive applied over all areas thereof, and after drying, the transfer sheet may be immediately applied to transfer the transfer medium to a desired substrate surface, by burnishing the image against the surface and pulling the transfer sheet free of same, to leave the enlarged image in place, or stored in a release coated wrapping until needed.

3 Claims, 10 Drawing Figures

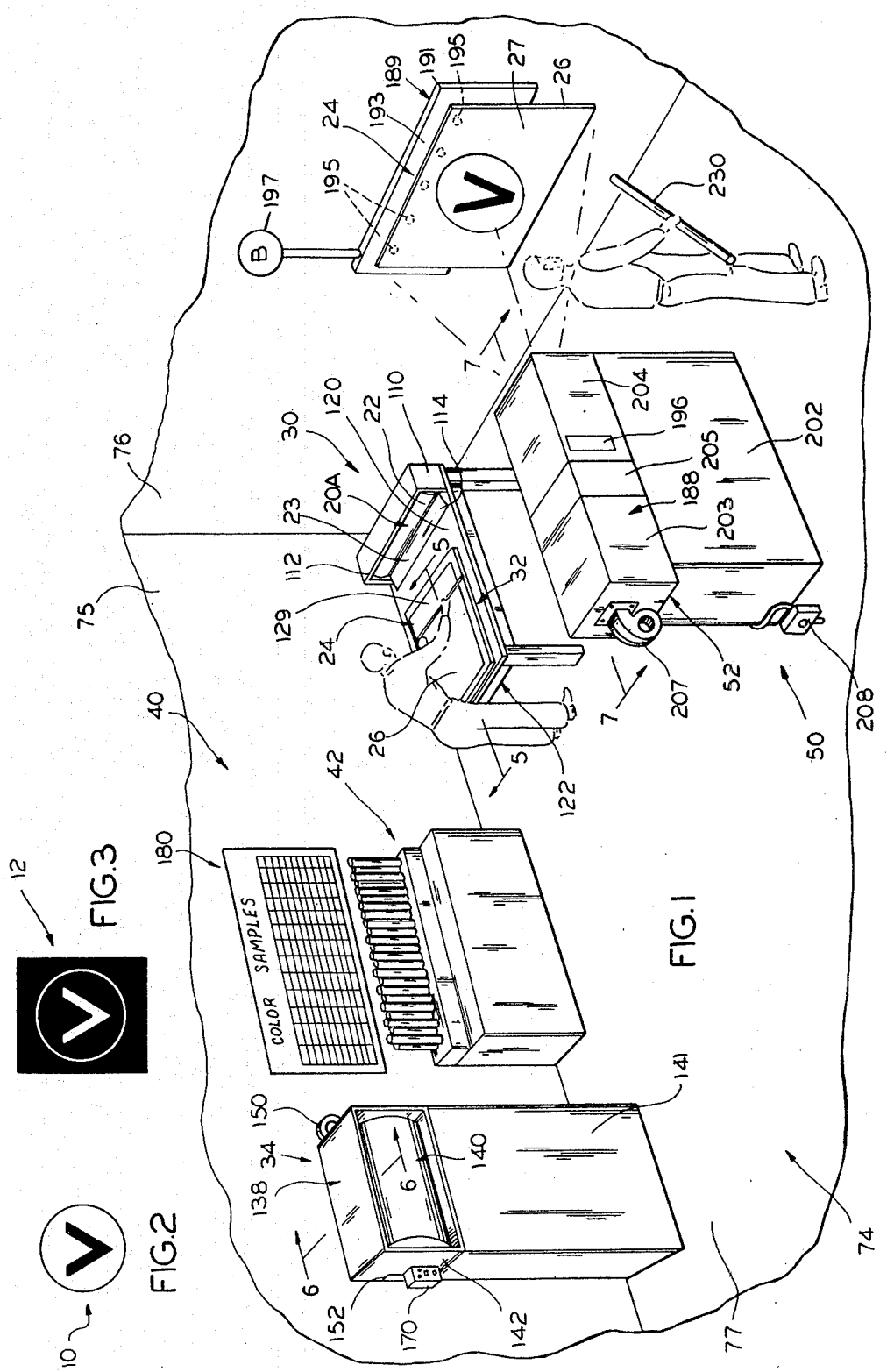

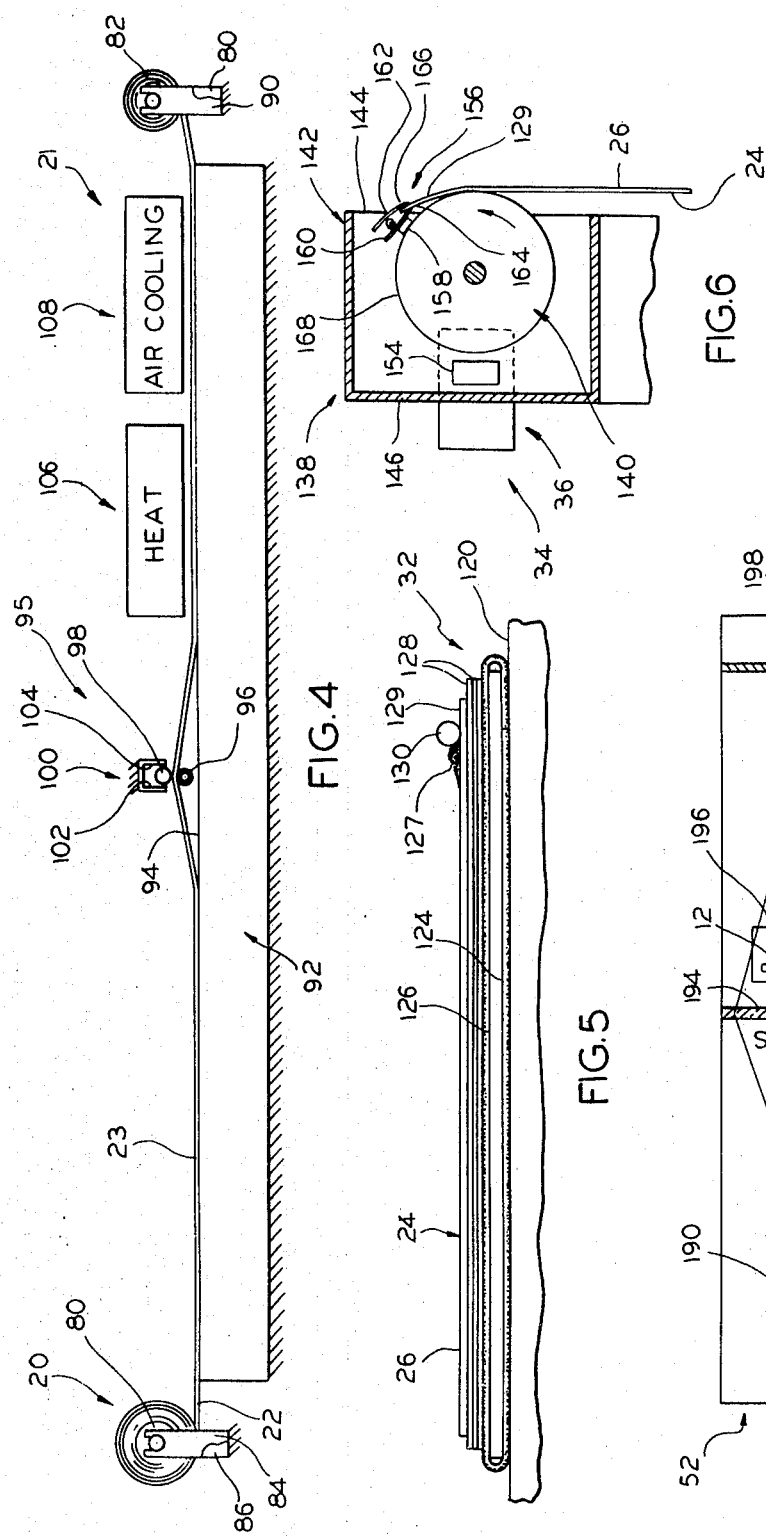

U.S. Patent   Jun. 29, 1982   Sheet 3 of 3   4,337,293
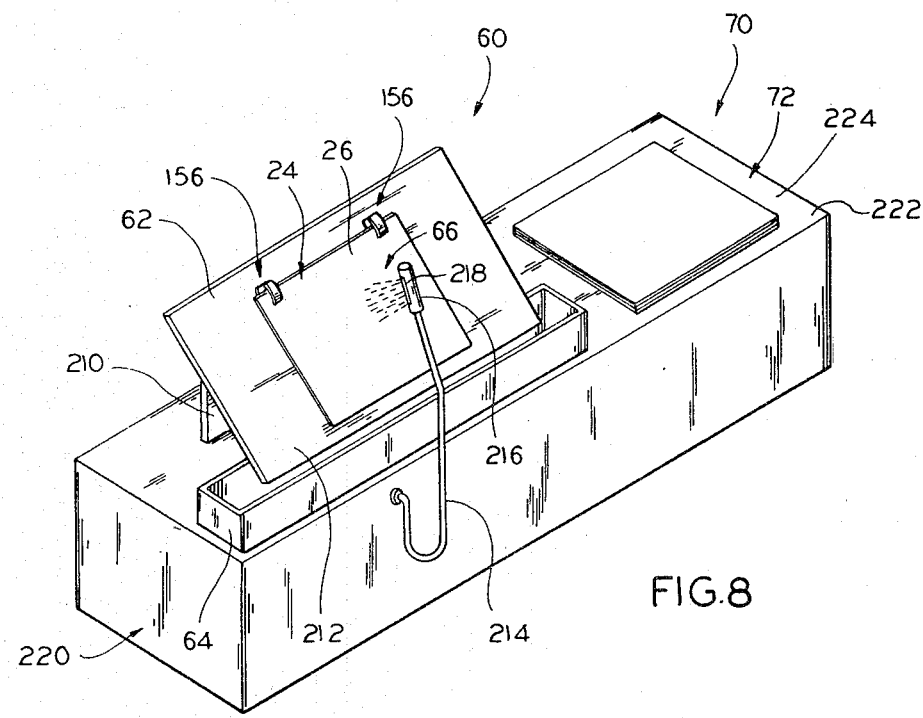
FIG.8
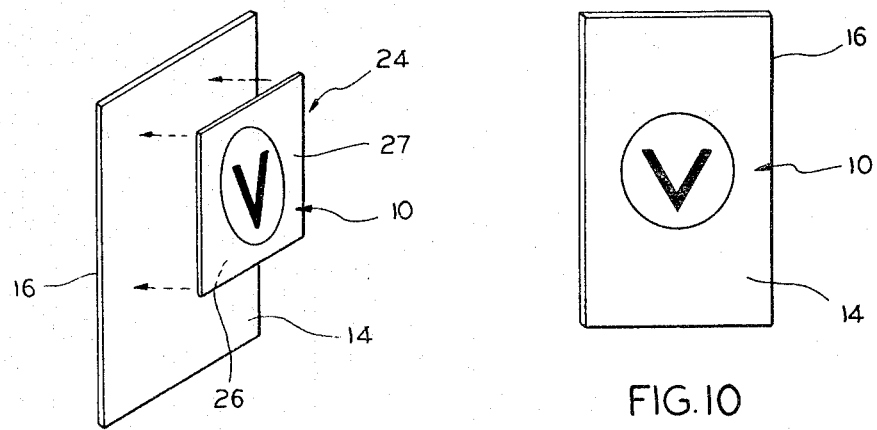
FIG.9
FIG.10

SYSTEM OF MAKING CUSTOM TRANSFERS

This application is a division of my application Ser. No. 175,317, filed Aug. 4, 1980, now U.S. Pat. No. 4,304,837.

This invention relates to a system of custom transfers for affecting application to a substrate surface in an enlarged form a picture or other two dimensional work of art, a sign, a trademark or company name, an advertisement, or the like, as the same would appear in a book, periodical, flyer or other publication, or perhaps might be created just for this purpose, and more particularly, to an image transfer system whereby any image that may be photographed may be transferred in enlarged form from the resulting photographic negative to any substrate surface adapted to have an image adhered thereto.

This invention has the objective of making available to those working in the graphic arts a custom transfer system whereby, as to any piece of two dimensional art work, word or wording, or symbol indicia, drawing or diagram, photograph, or the like, the image involved may be translated into a photographic negative, and then processed using the implements, materials, devices and apparatus, and methods of the system to effect applications of the image to any substrate surface, and in enlarged form, if so desired, and in any selected color.

A principal objective of the present invention is to provide a system of custom transfers whereby for any selected image to be duplicated and applied to a selected substrate surface, a sensitized transfer medium is formed on a sheet of transfer film, to which the image is photographically applied, after which the resulting transfer medium is given a pressure sensitive adhesive coating for application of the image, rub on fashion, to the selected substrate surface.

Another principal object of the invention is to provide a system of custom transfers in which a selected image may be reproduced in enlarged form and in any desired color for rub on transfer to the surface of walls, poster boards, boxes, wallpaper, containers, book covers, or the like.

Still another principal object of the invention is to provide a system of custom transfers that provides for the preparation of a sensitized transfer medium for each image to be transferred, on a transfer film, to which the selected image may be photographically applied, developed, and pressure sensitive adhesive backed, in which the materials and procedures are water based throughout.

Yet another important object of the invention is to provide a system of custom transfers in which the materials, apparatus and implements, and processing steps employed have been standardized and refined so that the system may be readily adapted and routinely practiced by even those that have little experience in the art of making custom transfers.

Yet further objects of the invention are to provide, for practicing the basic custom transfer system of this invention, a film arrangement in sheet or roll form that is pre-prepared for custom transfer image application and development purposes, to provide a coating board arrangement for trouble free application to the individual film sections to which the image is to be applied the several water based coatings that are contemplated by the invention, to provide a simplified and effective film section heat type drying arrangement that promptly dries out the film coatings to be applied to individual film sections being processed by the practice of the invention, to provide a projector especially arranged to effect photographic application of the image to the film sections in enlarged form, to provide a film section water spray washing arrangement for developing the image so transferred, and completing the transfer medium involved to the final shape of the image, and to provide a simplified overall processing procedure that is efficient and economical in use, and that may be readily adapted for use in making a wide variety of illustrations, presentations, displays, instructions, and other and similar purposes in the industrial, educational, commercial, and scientific fields.

In accordance with the invention a system of making custom transfers is provided which effects the application of the image to a transfer implement in the form of polyvinyl chloride film in sheet form on which is applied a transfer medium that in the practice of the invention is sensitized and color pigmented to have photographically formed on same the selected image, from a photographic negative that bears the image. Development of the image on the transfer implement shapes the transfer medium to the exact delineation defined by the image, and in the color selected after which the transfer implement on its transfer medium bearing side has applied to same a coating of a suitable pressure sensitive adhesive. When the processing of the transfer implement is completed, the transfer medium, which is now in the shape of the image, may be rub on transferred to any desired substrate surface, after which the transfer implement is pulled from therefrom to leave the image applied to the substrate surface and appearing as though the image were directly printed on the substrate surface.

In accordance with the invention, the transfer implement for each image to be so transferred is polyvinyl chloride film on the order of 0.005 inch in thickness, and in accordance with the practice of the invention the film is made available in roll form to the user of the process and is pretreated to have on the side of same that is to bear the transfer medium a polyvinyl alcohol overcoated adhesion and release coating that forms an incipient transfer medium.

When an image has been selected and made available in photographic negative form for transfer purposes, a section of the pretreated polyvinyl film is cut to a size somewhat in excess of the desired image size (as it is to be transferred), from a roll of the film; the resulting film sheet is laid on a special coating board arranged in accordance with the invention, with its pretreated side facing upwardly, and has a first color pigment free sensitized polyvinyl emulsion applied thereto, and to its incipient transfer medium, which is then dried and followed by a second coating of sensitized polyvinyl emulsion that includes color pigment of the color desired for the image to be transferred, after which the second coating is dried, to complete the formation of the sheet sensitized transfer medium.

The sheet forming the transfer implement being processed is then mounted in front of an ultraviolet light equipped projector that mounts the photographic negative bearing image to be transferred, with the projector being operated to direct the ultraviolet light through the negative photographic enlarger fashion, and directed on the transfer implement sensitized transfer medium, for a suitable exposure time, after which the transfer sheet is in effect developed by employing water spray techniques to wash away the unexposed sensitized polyvinyl that leaves the transfer medium shaped to delineate the image and in the selected color of the color pigment chosen for the image to be transferred. After drying, the transfer sheet is again applied to the coating board with its transfer medium side facing upwardly and has a uniform layer of a suitable pressure sensitive adhesive applied to the entire area of the transfer sheet being processed. After the practice of a further drying procedure, the transfer sheet is now conditioned to transfer the image to the desired substrate surface, by transferring the adhesive backed transfer medium thereto. This is done by placing the transfer medium, adhesive coated side of the transfer sheet against the substrate surface in question, burnishing the image against the surface with finger or hand pressure or the like, and then pulling the transfer sheet free of the image to leave the enlarged image in place. As the color pigmented polyvinyl forming the image and the transfer medium precludes adhesion of the pressure sensitive adhesive to the transfer sheet, while the pressure sensitive adhesive firmly adheres to the transfer sheet in a void portion of the image as defined by the transfer medium, the finalized transfer medium, which has the exact shape of the desired image, remains adhered to the substrate surface by the adhesion of its pressure sensitive adhesive backing thereto, while the remainder of the pressure sensitive adhesive remains firmly adhered to the transfer sheet and is separated from the resulting image and substrate surface when the transfer sheet is pulled free therefrom.

The application of the image to the substrate surface following the practice of this invention may take place as soon as the processing of the transfer sheet is completed, or the transfer sheet may be rolled in silicone coated paper or the like, and stored until use is desired.

Other objects, uses, and advantages will be obvious or become apparent from a consideration of the following detailed description and the application drawings, in which like reference numerals indicate like parts throughout the several views.

In the drawings:

FIG. 1 is a diagrammatic perspective view illustrating several of the basic components of the system of the invention and in showing the system projector being used in exposing a transfer sheet that has been sensitized by the practice of the invention, using ultraviolet light to effect application of a selected image to the transfer sheet;

FIG. 2 shows a simplified image in the form of a trademark logo that is employed to illustrate the use of the implements, materials, devices and machines, and processing procedures in practicing the system of this invention;

FIG. 3 illustrates the image of FIG. 2 as it is embodied in a photographic negative that is taken in accordance with the practice of the invention to effect application of the image to the system image transfer implement, utilizing the projector that is diagrammatically illustrated in FIGS. 1 and 7;

FIG. 4 diagrammatically illustrates a processing way and equipment therefor for preprocessing the polyvinyl film that the user of the system is to have on hand in roll form for practicing the invention;

FIG. 5 is a fragmental side elevational view diagrammatically illustrates a novel resilient coating board arrangement that is illustrated in FIG. 1 in block diagram form, and to which cut off sections of the polyvinyl film that form the individual transfer implement sheets in the practice of the invention are applied for coating purposes;

FIG. 6 diagrammatically illustrates a rotatable drum type film sheet coating drying arrangement that is suggested for practicing the invention;

FIG. 7 diagrammatically illustrates the nature of the projector shown in FIG. 1 for projecting the image that is applied to the photographic negative of FIG. 3 onto the sensitized polyvinyl film sheet section that forms the transfer implement in accordance with the practice of the invention;

FIG. 8 diagrammatically illustrates a water spray washing arrangement whereby the exposed transfer sheet is developed by being washed down to remove from same the unexposed polyvinyl chloride to reduce the transfer medium of the transfer sheet to define the exact delineations of the image being transferred;

FIG. 9 illustrates diagrammatically an upright wall surface and the transfer sheet, bearing the transfer medium, about to be applied thereto to transfer the image to the wall surface that forms the substrate surface of this illustration; and FIG. 10 shows the wall surface having the image transferred thereto, which is an exact reproduction of the trademark logo shown in FIG. 1 in enlarged form, with the transfer sheet removed therefrom.

However, it is to be distinctly understood that the specific drawing illustrations provided are supplied primarily to comply with the requirements of the Patent Laws, and that the invention is susceptible of modifications and variations that will be obvious to those skilled in the art, and which are intended to be covered by the appended claims.

GENERAL DESCRIPTION

Reference numberal 10 of FIG. 2 generally indicates a trademark logo of simplified design that is provided purely for illustrating the practice of the invention that contemplates the making of a photographic negative 12 of the logo as illustrated in FIG. 3, using standard photographic equipment and techniques, and using the system of the invention to apply the image of FIG. 2 in enlarged form to the substrate surface 14 that in the showing of FIGS. 9 and 10 is the finished surface of the wall structure 16 of any suitable type. It is to be understood, however, that the substrate surface represented by surface 14 may be the surface of any structure to which it is desired to apply an image such as that shown in FIG. 2, such as signs, on the sides of vehicles, containers, billboards, or the like that might be employed to advertise a product sold under the indicated logo.

It is also to be understood that the invention was devised to make available to those working in the graphic arts a custom transfer system whereby any piece of two dimensional art work, word or symbol indicia, drawing or diagram, photograph, or any medium of expression fixed or delineated in two dimensional form, may be embodied in a photographic negative, and the processed using the system to effect application of the image to any substrate surface, and in enlarged form where so desired and in any selected color.

In accordance with the practice of the invention, the image that is fixed into a tangible photographically transferrable form, as in a negative 12, is transferred by photographic techniques to a film in sheet form that is arranged in accordance with the invention. The film is polyvinyl chloride in sheet form that is pre-prepared for use in practicing the invention, by having the side of the same, to which the image of the negative 12 is to be applied, processed to have an adhesion and release coating applied thereto that is overcoated with a polyvinyl alcohol emulsion. The polyvinyl chloride sheeting preferably is obtained and kept on hand in elongate sheeting roll form, such as in the form of roll 20 of FIG. 4, and that is processed in the manner that will be specifically described hereinafter with reference to the showing of FIG. 4 to provide an incepient transfer medium that is borne by the polyvinyl sheeting in question. The sheeting 22 in the form of rolls 10 is pre-prepared as indicated and stored in roll form until needed.

Assuming that the image to be applied to the substrate surface 14 is selected as being the trademark logo of FIG. 2, the logo is photographed using conventional photographic techniques and the negative 12 developed using conventional photographic development techniques. While the specifics of negative and transfer sizes employed in the practice of this invention are largely a matter of choice or design, the image of FIG. 2 may conveniently be photographically applied to a negative 12 of 6 by 8 inches in dimension using conventional commercially available equipment for this purpose, and in practicing the invention a transfer size 30 by 40 inches or larger may be provided from this size negative, depending upon the user's requirements and the specific equipment set up involved. While it is contemplated that in the normal practice of the invention the image as it appears on the transfer will be in enlarged form, images of the same size as the original image may be transferred utilizing the principles of this invention.

In any event, the equipment set up and materials employed in utilizing same in accordance with the invention, as diagrammatically illustrated in the drawings, are arranged for photographically applying the image as embodied in a 6 inch by 8 inch photographic negative to transfers processed and arranged in accordance with the invention that are 30 inches by 40 inches or larger in size.

In any event, when the image to be transferred has been selected and the size of the image as transferred to the substrate surface is determined or specified, a section of the film sheeting 22 is cut to a size, in quadrilateral form, that is somewhat larger than the image and size as it is to be applied to the substrate surface 14.

The cut off sheet forms the transfer implement in the practice of the invention, which may be termed "a transfer". In the drawing illustrations the transfer sheet or implement involved is indicated by reference numeral 24, and its pre-processed side that has the transfer medium, incepient or otherwise, as indicated by reference numeral 26.

The transfer sheet 24 in the practice of the invention is applied to a coating station 30 that is diagrammatically illustrated in FIG. 1 that has a special resilient coating board assembly 32 applied thereto that is more specifically illustrated in FIG. 5, with the transfer sheet 24 being applied to the coating board assembly 32 with its transfer medium bearing side 26 facing upwardly. At the coating station 30, the transfer sheet side 26 has applied to same a first color pigment free sensitized polyvinyl emusion that is applied in a uniform coating across the side of the transfer sheet 24, after which the transfer sheet 24 is applied to a drying station 34 that is diagrammatically illustrated in FIG. 1 and more specifically illustrated in FIG. 6, for passing the transfer sheet 24, and specifically its side 26 past a heat source 36 for drying the sensitized polyvinyl emulsion coating.

The sheet 24 is then returned to the coating station 30 and positioned for application to its side 26 of a second sensitized polyvinyl emulsion that includes color pigment of the color selected for depicting the image as it is to be applied to the substrate 14. The pigment color involved is of course a matter of choice and in the practice of the invention, it is convenient to have as a part of the equipment involved a pigment mixing station 40 equipped with a suitable pigment mixing apparatus 42 to make available for incorporation in the second polyvinyl emulsion coating color pigments giving the color desired for depicting the image as it is to be applied to the substrate surface 14.

After the application of the second sensitized polyvinyl emulsion, color pigment bearing coating, the transfer sheet 24 is again applied to the heating station 34 for drying of such coating.

The transfer sheet 24 is then applied to a projector station 50 which in accordance with the invention is equipped with a projector apparatus 52 that is equipped as diagrammatically illustrated in FIG. 7 for projecting through the negative 12 a beam of ultraviolet light that is concentrated by suitable lensing to throw the image as enlarged by the projector apparatus 15 on the transfer sheet 24, which is suitably mounted in front of the projector apparatus 52 for this purpose, as indicated in FIG. 1, with the transfer sheet side 27 facing the projector and spaced therefrom to provide the desired degree of enlargement of the image, on the now sensitized transfer medium, that is to be applied to the transfer sheet side 26 through sheet 24 from its side 27. The exposure time involved will vary from about four to about eight minutes, depending on the color of the image that is to be provided.

After exposure in the manner indicated, the transfer sheet 24 is transferred to water wash down developing station 60 where the sheet 24 is applied to a fixed plate type support 62 above a trough 64 for application thereto of water at a temperature in the range of from about 100 degrees F. to about 110 degrees F. using a fan type spray, indicated at 66 in FIG. 8, for this purpose. The fan type spray 66 is hand moved across the side 26 of sheet 24 to wash from the transfer medium that has been applied to same the unexposed portions of the sensitized polyvinyl material involved, which are water soluable and are washed away. The exposed sensitized portions of the transfer medium have been hardened under the tanning action provided by the ultraviolet light and are water insoluable. The result is that the washing away action of the fan type spray 66 on the transfer sheet 24 reduces the transfer medium on the side 26 of the sheet to the color pigmented tanned polyvinyl chloride that delineates a perfect representation of the image involved, but in the enlarged form shown in FIG. 9.

Thereafter, the sheet 24 is applied to a blotting station 70 (see FIG. 8) where the side 26 of the sheet 26 is hand pressed against a newsprint layer 72 to blot dry the sheet side 26. Thereafter, the transfer sheet 24 is again applied to the drying station 34 and dried, after which the sheet 24 is again applied to the coating station 30 and positioned as indicated in FIG. 5 for application thereto of the coating of suitable pressure sensitive adhesive over the entire side 26 of the sheet 24.

The sheet 24 is then reapplied to the heating station 34 for a final drying step, which completes the preparation of the transfer sheet 24 for transfer purposes.

The image on the transfer sheet 24 may now be transferred to the substrate surface 14 by taking the sheet 24 with its side 26 facing the surface 14 and pressing the sheet side 26 against the surface 14. In doing this, the user employs hand and finger rub on burnishing action against all portions of the image as it appears from the back side 27 of the transfer sheet to achieve firm adherence of the transfer medium that now delineates the image to the surface 14. In this connection, as the unexposed polyvinyl has been washed away in the developing step, the adhesive that forms the final coating on the transfer sheet firmly adheres to the transfer sheet side 26 since it is in direct physical contact therewith, and has been pressed thereagainst by the application thereto of the adhesive coating involved. However, the exposed color pigment bearing polyvinyl that now defines the image separates the adhesive from the side 26 of the transfer sheet so that the adhesive has no adherence to the transfer sheet side at these locations. However, the adhesive in being pressed against the surface 14 firmly adheres thereto.

The result is that when all portions of the sheet 24 that overlie the image defined by the transfer medium on the side 26 of the sheet have been hand burnished against the surface 14, the sheet 24 may be separated from the transfer medium which forms the so-called "transfer" involved by grasping one edge of the sheet 24 and pulling it away from the surface 14, taking due care to avoid distorting the image as formed in the transfer as this procedure is done. The result is that the sheet 24 is peeled free of the transfer medium that defines the image imvolved, which is now fully transferred to the substrate surface 14, free of the transfer sheet 24, as indicated in FIG. 10.

Alternately, the fully processed sheet 24 may be rolled in silicone coated paper or the like, with the side 26 engaging the silicone coating, and stored in a suitable container until needed for providing the image on the substrate surface 14.

The stations 30, 34, 40, 50, 60, and 70 may be conveniently set up in a work room area as suggested by FIG. 1, for forming the apparatus installation 74, which area is shown partially defined by walls 75 and 76, and floor 77 for illustrative purposes only.

The specific nature of the system materials, implements, devices, and operating procedures will now be described in detail with more specific reference to the drawing figures that have been provided.

THE TRANSFER SHEETING PRE-PROCESSING STATION

As already indicated, the elongated sheeting or web 22 from which the individual transfer sheets 24 are formed is polyvinyl chloride. While this product is available commercially from a number of sources, Union Carbide Corporation's polyvinyl chloride product 3617 Clear 401 is preferred for the practice of the invention, in a thickness of 0.005 inch. As this product is supplied by the manufacturer, it comes in rolls 20 and the sheeting involved is transparent and neither side has been pretreated, in the practice of my invention, in any way. In accordance with the invention, the sheeting 22 is pre-treated in the following manner, and as diagrammatically illustrated in FIG. 4.

The sheeting 22 is applied to a processing way 21 (see FIG. 4) which is conveniently a facility separate from apparatus installation 74, and which for purposes of disclosure is illustrated by a first pair of supports 84 and 86 mounted to receive for rotation about a horizontal axis a roller 80 on which the sheeting 22 is wound for winding the sheeting 22 up on a roller 82 at the other end of the processing way which is suitably mounted in suitable support 88 and 90 for rotation about a parallel horizontal axis. Intermediate the roller supports for the rollers 80 and 82 is a fixed support table or platform 92 that is illustrated in block diagram form as it may be of any appropriate arrangement defining a horizontal support surface 94 across which the leading end of the sheeting is pulled. The work platform or table 94 adjacent its mid portion has a suitably fixed support bar 96 extending thereacross over which the sheeting 22 is passed, with a conventional Mayer squeegee rod 98 riding on top of the sheeting 22. As diagrammatically illustrated in FIG. 4, the Mayer rod 98 at each of its ends is provided with a guide device 100 defining vertical spaced apart guide surfaces 102 and 104, which permit vertical movement of the Mayer rod 98, but maintain it in vertical alignment with the bar 96. The ends of rod 98 preferably extend outwardly of the guide forming surfaces 102 and 104 sufficiently so that downward pressure can be applied to same as needed, when sheeting 22 is pulled through for adequate squeegee performing purposes. Downstream of the squeegee assembly 95 is a suitable infrared heating apparatus 106, and a suitable suction type air cooling apparatus that are only block diagram illustrated as they may be of any suitable type.

The pre-processing of the sheeting 22 involves the application of two coatings to the side 23 of the sheeting 22 that is to be the pre-treated side 26 of the individual transfer sheets 24.

The initial coating to be applied to the sheeting side 23 is a mixture comprising twenty parts isopropyl alcohol, one part wax, and one part talcum powder. The wax may be the Simonize automotive wax product made and sold by Union Carbide Corporation. The talcum powder may be a common toilet powder, such as Johnson's Baby Powder.

With the leading end of the sheeting 23 being pulled through the processing way by hand, the indicated mixture, which forms the adhesion and release coating of the sheeting 22, is uniformly applied by hand to the side 23, using cloth or brush applications, or other suitable implements. For this coating, the pulling of the sheeting 23 through the squeegee assembly 95 is not necessary to insure that the adhesion and release coating will be uniformly distributed across the width of the sheeting 22, as this can be effected using implements of the type indicated. The sheeting 22 may thus, for this initial coating, be pulled over the top of bar 98, and then under the heating apparatus 106 and air cooling apparatus 108, with drying heat being first applied to the coating across the width of the sheeting 22, and then the suction type air cooling apparatus draws air into same across the side 23 and for its width, to cool the coating. The thus coated sheeting 23 is then wound up on the roller 82, as it is being coated, as by employing a suitable hand crank (not shown).

After the adhesion and release coating has been applied to the sheeting 22, the positions of rollers 80 and 82 are reversed, to return the sheeting 22 back across the operating way 21 for application thereto of the polyvinyl alcohol emulsion. Rollers 80 and 82 may be suitably removably mounted for this purpose, though, of course, sheeting 22 could just be pulled back to and rolled up on roller 80. The polyvinyl emulsion is polyvinyl alcohol dispersed in water, with the mixture being free flowing but not too thin. With the now leading end of the sheeting 22 disposed to extending from the roller mounting at the left hand end of way 21, and protrude through the squeegee device 95, a quantity of the polyvinyl alcohol emulsion is applied across the width of the sheeting 22, to the left of bar 98, which coating is smoothed out across the width of the sheeting 22 by the squeege action of the Mayer bar 98 as the sheeting is moved through squeegee assembly 95 to the roller on supports 88 and 90 (now roller 88) for winding thereon. As the processing of the sheeting 22 proceeds through way 21 to apply the polyvinyl emulsion thereto, the quantity of same downstream of the squeegee apparatus 95 is maintained sufficient in amount so that as the sheeting 22 emerges from the squeegee apparatus 95, the emulsion is of a smooth coating thereacross, which is successively dried and cooled by the respective apparatus 106 and 108, with the sheeting 22 as completed again being rolled thus stored until needed.

The Mayer rod 98 is a steel rod of basically cylindrical shape having a fine threading in its external surfacing for squeegee purposes. These rods are commercially available devices commonly used for smoothly squeeging films or coatings on sheeting.

THE COATING STATION

At the coating station 30, a length of the sheeting 22 in the form of dispensing roll 20A is disposed in enclosure 110 that has an open front side 112 from which the leading end 114, of the polyvinyl sheeting 22 that has been treated in the manner described in connection with the showing of FIG. 4 projects for grasping to cut off sheets 24 as needed. The sheeting 22 as applied to the coating station 30 will thus have applied to same the aforedescribed adhesion and release coating which is overcoated with the polyvinyl alcohol that is left after the water of the emulsion form in which it is applied to the sheeting 22 has evaporated.

As indicated, when a transfer sheet 24 is to be prepared, the sheeting 22 is cut at its end 114 to separate therefrom a sheet 24 that is somewhat larger than the size of the transfer that is to be applied to the substrate surfacing 14, which transfer, of course, is to bear the image to be transferred, for instance the image of the logo as shown in FIGS. 2 and 3, but in enlarged form, as depicted in the showing of FIG. 1 when the logo is in the process of being photographically applied to the transfer.

The severed sheet 24, which when processed will be the transfer sheet for applying the enlarged image to the substrate surface 14, at the coating station 30 is placed on the coating board 72 which is shown in block diagram form in FIG. 1, and in diagrammatic side elevational form in FIG. 5.

In the diagrammatic illustration of FIG. 1, the enclosure 110 for the roll 20 and the coating board 72 are disposed on the top 120 of a suitable work table 122, with the coating board 32 thus being supported in horizontal relation at a convenient working height above floor 77 for the individual who is to apply the coatings contemplated by this invention to the transfer sheet 24.

The coating board 32 comprises a planar rigid core 124 of quadrilateral configuration formed from a non-shedding rigid material such as hardboard or glass (masonite is suggested) that has a length and width that will somewhat exceed the largest size sheet 24 that will be processed in practicing the invention, which core 124 is provided with a piled fabric cover 126, of which the top and bottom surfaces of the core 124 are fully enclosed within the cover 126, as by looping the cover 126 over opposite ends of core 124, with the cover 126 being disposed so that its pile faces outwardly of the core 124. In a preferred form, the cover 126 is a sheet of fine pile Velcro sheeting. Placed on top of the cover 126 are three or four sheets of paper 128 that may comprise commercial wrapping paper or its equivalent, and have a size similar to that of core 126.

The film section 24 in being processed is laid on top of the sheet 128 of paper with its processed side 26 that is to be sensitized facing upwardly. The sheet 24 is now positioned to receive the first coating of sensitized polyvinyl alcohol emulsion.

This first coating is a mixture consisting of eight parts polyvinyl alcohol that is colorless or pigment free and one part ammonium bichromate solution, the latter being a solution consisting of eight parts water to two parts ammonium bichromate crystals. In applying the sensitized polyvinyl alcohol emulsion to the sheet 24, a mound 127 of the resulting holding viscous mixture is applied along one edge of the sheet 24, for instance its edge 129 of FIGS. 1 and 2, and then it is squeegied across the side 26 of the sheet 24, using a Mayer squeegee rod 130 for this purpose, with the user grasping the rod in his hands as indicated in FIG. 1, pressing the rod firmly downwardly against the resilient support action provided by coating pad 32, and shifting the rod toward and away from the rod user by pulling and pushing effort to smooth the mound of polyvinyl emulsion across the entire side 26 of the sheet 24. The fixed support offered by table top 120 and the resiliently compressible nature of coating board 32 permits the movement of the Mayer rod 130 across the sheet side 26 to uniformly smooth the coating being applied smoothly across the entire area of the sheet side 26. It is ordinarily sufficient to pass the Mayer rod 130 across the area of side 26 of the sheet 24 three times.

The Mayer rod 130 is, like the Mayer rod 98 of FIG. 4, a basically cylindrical steel rod approximately one inch in diameter and having its surface formed with a fine threading. Other types of squeegee devices will serve satisfactorily, though the use of the Mayer squeegee rod is preferred for practicing this invention, because of its effectiveness the manually smoothing out the costings to be applied to sheet 24 into a void free layer of uniform thickness.

The thus applied polyvinyl emulsion is then dried at the drying station 34.

THE DRYING STATION

The drying station 34 is diagrammatically illustrated in FIGS. 1 and 6, and comprises a dryer assembly 138 including a drum 140 suitably journalled in enclosure 142 that has open side 144 that provides ready access to the drum 140 enclosure is mounted on suitable support 141 that disposes roller 140 at a height that is convenient for the worker to apply the sheets 24 thereto in the manner indicated in FIG. 6. The drum 140 is suitably powered to rotate counterclockwise of FIGS. 1 and 2 when operating, and heat source 36 is built into the closed back side 146 of the enclosure 142. Heat source 36 may comprise an electric heater of the room heating type that provides an air flow therefrom at a temperature on the order of 150 degrees F., with the enclosure 142 also suitably mounting a suitable blower apparatus 150 that circulates the ambient air past the heat source 36 through window 152 and out of window 154, and thus between the drum 140 and the heat source 36. As indicated in FIG. 6, the windows 152 are aligned with the space that separates the drum 140 from heat source 26.

In practicing the invention, the worker picks up the freshly coated sheet 24, applies to one of its edges, for instance, the edge 129, a pair of magnetic gripping clips 156 in spaced apart relation, and applies the sheet 24 in hanging relation to the drum 140 (when the drum 140 is stationary). The clips 156 may be any commercially available device of this type which includes a plate type permanent magnet 158 (see FIG. 6) affixed to one clip member 160, with the other clip member 162 being suitably hinged to the first clip member 160 and suitably spring biased to the closed position, whereby the edge 129 of the sheet 24 is grasped between the clip gripping ends 164 and 166. The clips 156 are disposed in spaced apart relation on the edge 129 of the sheet 24 and their magnets 158 placed in magnetic attraction relation with the drum surface 168, which is formed of a suitable magnetically attractive material for this purpose, with the sheet 24 positioned relative to the drum 140 so that its upper end lies substantially tangent to drum 140, and its side 26 faces away from the drum surface 168. Using suitable control box 170 (see FIG. 1) that is provided for off on control purposes, the heat source 36, the blower 150, and the drum 140 are actuated, with the drum being turned in the direction indicated in FIG. 6, so as to draw sheet 24, and in particular its coated surface 26, past the heat source 36 and through the air flow provided by blower 150. When the sheet 24 has been brought past the heat source 36 several times, the first sensitized polyvinyl emulsion coating will be dried, which will ordinarily take about two to three minutes, depending on the speed of operation of the drum 140.

In connection with the showing of FIG. 6, the clip 156 there illustrated is shown in disproportionately large size to make its diagrammatically illustrated components clear. The drum 140 is proportioned in diameter so that for any use of the heating station 34 that is required, the transfer sheet 24 being heated will not overlap the clips 156.

THE SENSITIZED COLOR PIGMENTED POLYVINYL EMULSION COATING

The now dried sheet 24 is returned to the coating station 30 and reapplied to coating board 32 in the manner indicated in FIG. 5 for application thereto of the color pigmented sensitized polyvinyl emulsion.

This second polyvinyl emulsion coating is a mixture consisting of one part liquid ammonium bichromate solution (that consists of the indicated solution of eight parts water to two parts ammonium bichromate crystals, as described above in connection with the first polyvinyl emulsion coating) and 24 parts of color pigment containing polyvinyl alcohol that consists of one part color pigment of the color selected for the image to be transferred and one part polyvinyl alcohol. The color pigment itself may be the same as the finely ground pigments used by artists, and in the practice of the invention, color mixing station 40 is provided at which conventional color mixing apparatus 42 is installed to make available any desired color in the form of pigments to be included with the pigment bearing sensitized polyvinyl emulsion that is to be applied to the sheet 24 as its second sensitized coating, with the colors available being conveniently indicated by color chart 180 that is suitably coded to provide varient color selections in accordance with conventional pigment mixing and blending techniques.

The sensitized color pigment bearing polyvinyl emulsion thus formulated is then applied to the sheet 24 in the same manner as the colorless sensitized polyvinyl emulsion, and dried in the same manner as previously described in connection with that coating, at the drying station 34.

With the second polyvinyl emulsion coating dried, the transfer sheet 24 is now in condition for exposure to receive the image defined by the negative 12 of FIG. 3.

THE PROJECTOR

The projector 52 at projector station 50 is diagrammatically illustrated in FIG. 7, and comprises a suitable opaque enclosure 188 having ultraviolet light source 190 and associated conventional reflector 192 conventionally mounted therein, fresnel lens 194, and removable negative mounting frame 196 which suitably removably mounts negative 12. The ultraviolet beam thus provided passes through lens 194 and negative 112 and through suitable aperture lens 198 for application to a transfer sheet 24 suitably mounted in front of the projector for this purpose.

In practicing the invention, the ultraviolet light source is an Addalux mercury lamp available from Berkey Photo Inc. as its product Model No. 1406-02, which is operated by a Berkey control apparatus Model No. 1421-20, which is available from Berkey Technical of Woodside, New York.

The transfer sheet 24 may be mounted upright in any suitable manner in front of the projector 52 at the distance desired for the desired degree of enlargement. In the illustration of FIG. 1, for illustrative purposes, the sheet 24 is shown suspended by employing a suitable suction system, diagrammatically illustrated at 189 as comprising suitable planar vacuum chamber 191 having its flat mounting surface 193 formed with a plurality of suction ports 195 that hold sheet 24 at the desired elevation relative to projector 52; for this purpose chamber 191 is suitably connected to a source of vacuum, such as suitable blower 197 that is only diagrammatically illustrated. Suction system 189 may be mounted in place in any suitable manner.

Alternately, and instead of system 189, sheet 24 may be secured in its indicated exposure position using strips of pressure sensitive tape to secure its top edge directly to wall 76.

In any event, it is the back side 27 of sheet 24 that should face the projector for exposure purposes.

Following conventional procedures of the practice of photography, the image as formed on the negative 12 may be as small or as large as is practical for ordinary photographic equipment. It has been found convenient to mount the projector 52 on a suitable support 202 in fixed relation to the wall 76 so that the image in being thrown on the transfer sheet 24 will be enlarged five times. The timing of the exposure is controlled conventionally and will vary from about four to about eight minutes, depending on the color of the pigment applied to the sheet 24 being processed.

The amount of enlargement of the image as applied to the sheet 24 is basically a matter of choice. It is preferred that the negative mounting frame 196 have several mounting positions for the negative that will provide varient degrees of enlargement, for instance, enlargement of five times to enlargement of ten times. Of course, the projector could be movably mounted relative to wall 76 to provide for varying degrees of enlargement.

In the form shown, the projector enclosure is in the form of three separatable sections including light unit section 203, film mounting and image aperture section 204, and separator section 205 disposed between the two. Section 204 is supported on support to dispose its lens 198 at a predetermined distance from wall 76 (on which the sheets 24 to be exposed are to be mounted for that purpose) that will provide a predetermined fixed enlargement of the image. Section 205 interposed between sections 204 and 203 positions the light source at the correct distance from lens 198. Alternately, separator section 205 is disposed and keyed to support 202 at a predetermined distance from wall 76 that will achieve the same effect, with sections 203 and 204 then being brought into abutting light sealing relation with the respective ends of section 205. Section 203 may be equipped with suitable cooling blower 207, and the ultraviolet light control apparatus may include suitable foot operated off-on control 208. Blower 207 may also serve as the source of vacuum for suction system 189.

After exposure in the manner indicated, the film sheet 24 is moved for processing at the water wash down developing station 60.

THE WATER WASH DOWN DEVELOPING STATION

At the station 60 (see FIG. 8), the exposed sheet 24 is placed on inclined wash down plate 62 in the manner indicated in FIG. 8, using the magnetic clips 156. Sheet 62 may thus be formed from a suitable magnetic material such as sheet metal containing iron and suitably mounted as indicated at 210 to dispose its lower end in discharge relation to water trough 64 that is provided with suitable drain facilities. Alternately sheet 62 may be in the form of a sheet of a suitable plastic material, such as the acrylic resin sheeting sold under the trademark Plexiglas, to which a strip of magnetic material is suitably adhered along the upper edge of same for adherence thereto of clips 156. The fan type water spray 66 is provided by suitable hose 214 connected to a source of heated water under water main pressure having a temperature in the range of from about 100 degrees F. to about 110 degrees F. In the diagrammatic form illustrated, the hose 214 is connected to cylindrical head 216 which is water sealed thereabout except for elongate narrow slot 218 running longitudinally of its side that forms the fan type water spray 66 in question. However, the hose itself may be formed to define the slot 218, as by slitting same longitudinally thereof, with the free end of the hose being suitably sealed to insure the desired control application of the water discharge from the hose in the form of a spray 66.

The user may grasp the hose at or adjacent the nozzle 218 and apply the spray 66 over the side 26 facing the worker. As the exposure of the image on the sheet 24 effects a tanning of the sensitized polyvinyl that has been exposed to the ultraviolet light, which makes the polyvinyl involved insoluble in water, while the unexposed polyvinyl remains water soluble, the "development" of the exposed sheet 24 involves removal from the sheet 24, and the transfer medium that has been formed on same, of the unexposed polyvinyl chloride. Thus, the worker at the developing station 60 applies the spray 66 to the side 26 of the sheet 24 until all of the unexposed water soluable polyvinyl has been washed away. As the exposure of the transfer sheet 24 is from its back side 27, the exposed polyvinyl remains firmly adhered to the sheet 24. The source of water pressure is then suitably turned off and the sheet 24 being processed is moved to the blotting station 70.

THE BLOTTING STATION

The blotting station 70 and the developing station 60 in the showing of FIG. 8 are shown, for convenience of illustration, applied to the same basic support structure 220, with structure 220 as illustrated including an extension 222 that for purposes of illustration forms the blotting station 70. At the blotting station 70 one or more sheets of newsprint 72 are laid out on the horizontal supporting surface 224 involved, and the now developed sheet 24 is placed on the sheet 72 with its side 26 facing same, and is blotted dry by the working using moderate hand pressure to press the side 26 of the sheet 24 against the newsprint.

Thereafter, the sheet 24 being processed is again applied to the heating station 34 in the manner already described in connection with the showings of FIGS. 1 and 6, and passed through the drying apparatus involved several times to fully dry the sheet 24.

The dried sheet 24 is now moved back to the coating station 30 for application thereto of the pressure sensitive adhesive coating.

THE PRESSURE SENSITIVE ADHESIVE COATING

At the station 30 fresh paper sheets 128 are substituted for those employed to apply the polyvinyl emulsion and coatings to the sheet 24, and the thus far processed sheet 24 is applied to the coating board 32 in the manner indicated in FIG. 5 for application thereto of a suitable pressure sensitive adhesive. The adhesive involved may be and preferably is the water soluable pressure sensitive adhesive made and sold by U.S. Adhesive Corp. of Chicago, Illinois as its product No H-49, but as a matter of practice the adhesive may be any suitable pressure sensitive rubber based adhesive material including natural rubber, synthetic rubber, latex crepe rubber, rubbery synthetic polymers and copolymers and the like; commonly used tactifiers include rosin esters, such as ester gum, wood rosin and various resins such as hydrocarbon resins.

In any event, a quantity of the adhesive employed is applied to the side 26 of the sheet 24 following the procedures in using the coating board equipment described in connection with the applications of the polyvinyl emulsions thereto. Thus, a quantity of the adhesive is applied in a mound 127 along one edge 129 of the sheet 24 and smoothed out across the surface of the sheet side 26 using a Mayer squeegy rod 130. The rod 130 is operated in the manner suggested by FIG. 1, with the user pressing downwardly against the resilient coating board and moving rod 130 from one end of sheet side 26 to the other by pulling and pushing effort, to effect the application of a relatively thin, void free film of the adhesive uniformly over the side 26 of the sheet 24, which when dried will be on the order of 0.0005 inch thick.

The adhesive coated sheet 24 is now moved to the drying station 34, applied to same in the manner indicated in FIG. 6, and dried in the same manner which ordinarily takes several rotations of the drying drum to effect, depending on the adhesive employed.

The indicated water soluable adhesive is preferred because with the use of this type of adhesive, the Applicant's system is water based throughout its procedures.

The transfer sheet 24 having its adhesive coating dried is now in condition for application of same to the substrate surface 14 for transfer thereto to the enlarged image that is defined by the remaining transfer medium that is carried by the transfer sheet. As has been indicated, the color pigmenting that defines the image precludes the adherence to the polyvinyl-chloride sheeting of the pressure sensitive adhesive, which thus adheres to the substrate surface 14 when the transfer medium involved has been burnished against a surface 14. The remainder of the adhesive is adhered to the side 26 of the sheet 24 and pulls away from the surface 14 and the resulting transfer that forms the image, now enlarged as desired, that is indicated in FIG. 10. Thus, the transfer in its final transferred form defines the color portions of the image, with the clear portions being the substrate surface 14 itself.

Where the thus processed sheet 24 is not to be used immediately, as where the sheet 24 is processed pursuant to a customer's order for use by the customer elsewhere, sheet 24 is stapled to a sheet of release coated covering paper (for instance silicone coated), with the side 26 facing the release coated, and the two sheets rolled up for storage or shipment. For this purpose the thus wrapped sheets 24 may be applied to conventional cylindrical paperboard containers of the shipping type, such as container 230 of FIG. 1.

It will therefore be seen that the invention provides a convenient, inexpensive, and effective way of making custom transfers. The Applicant's system is conveniently water based throughout its processing, and its simplified procedures and implements can readily be practiced and utilized by unskilled help. The system can be widely used in the graphic arts, as by artists, sign painters, display companies, typography houses, and advertising agencies. The system can be used to provide transfers for signs, windows, displays, comps and finished art for ad agencies and art studios, sub-surface signs for architects (as, for instance, for nameplates, doors and windows). While enlargement of the image is not critical to the practice of the invention, enlargement is preferred in the usual practice of the invention because of the multiple uses the resulting transfers have and the many sources of art work and the like for providing subject matter to be made the subject of such transfers.

The sheeting 22 may be of any desired size; however, in the practical application of the invention, the sheeting is used in rolls 42 inches in width by 800 feet in length, with the individual sheets 24 being cut to size from same as needed.

The foregoing description and the drawings are given merely to explain and illustrate the invention and the invention is not to be limited thereto, except insofar as the appended claims are so limited, since those skilled in the art who have the disclosure before them will be able to make modifications and variations therein without departing from the scope of the invention.

I claim:

1. A substrate for making custom transfers, said substrate comprising:
polyvinyl chloride sheeting of film dimension thickness having one side of same bearing a dry composited coating comprising a uniform base coating of a uniform mixture consisting of approximately twenty parts isopropyl alcohol, one part wax and one part talcum powder that is overlaid with a uniform coating of polyvinyl alcohol.

2. The substrate set forth in claim 1 wherein:
said sheeting has a thickness approximating 0.005 inch.

3. The method of making a substrate for making custom transfers, said method comprising:
taking a polyvinyl sheet of film dimensions and coating one side of same with a uniform mixture consisting of approximately twenty parts isopropyl alcohol, one part wax, and one part talcum powder,
drying said coating,
overcoating said coating with a uniform layer of an aqueous emulsion of polyvinyl alcohol,
and drying said overcoating.

* * * * *